United States Patent [19]

Albachten, III et al.

[11] Patent Number: 5,014,247

[45] Date of Patent: May 7, 1991

[54] SYSTEM FOR ACCESSING THE SAME MEMORY LOCATION BY TWO DIFFERENT DEVICES

[75] Inventors: Rudolph J. Albachten, III; Robert W. O'Dell, both of Austin, Tex.

[73] Assignee: Advanced Micro Devices, Inc., Sunnyvale, Calif.

[21] Appl. No.: 286,200

[22] Filed: Dec. 19, 1988

[51] Int. Cl.$^5$ ............................................... G11C 8/00
[52] U.S. Cl. ........................... 365/230.05; 365/189.07
[58] Field of Search ....................... 365/230.05, 189.07

[56] References Cited

U.S. PATENT DOCUMENTS 4,603,406  7/1986  Miyazaki et al. .................... 365/229
4,860,263  8/1989  Mattausch ....................... 365/189.04

Primary Examiner—James Moffitt
Attorney, Agent, or Firm—Salzman & Levy

[57] ABSTRACT

A dual port random access memory device having a memory location which has interfaces for allowing at least two devices to access a given memory location. The memory location is subdivided into at least two portions. One of the portions is a source and one of the portions is a destination. A shadow updating mechanism is provided and connected to each of the memory location portions for allowing data stored in one of the portions to be copied into the other portion.

20 Claims, 10 Drawing Sheets

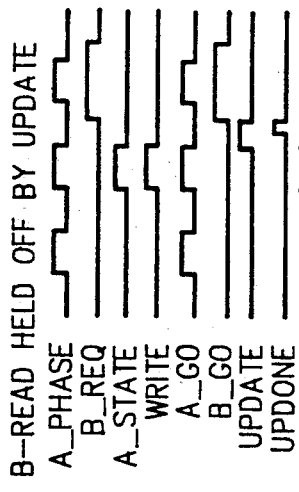
FIG.9a UNBLOCKED B-READ
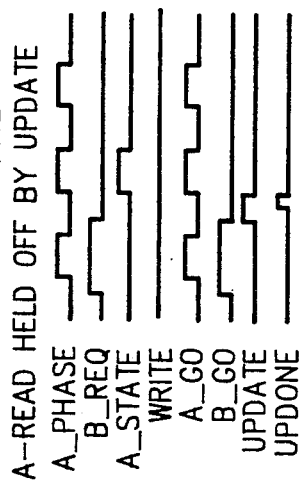
FIG.9b UNBLOCKED B-WRITE FOLLOWED BY UPDATE
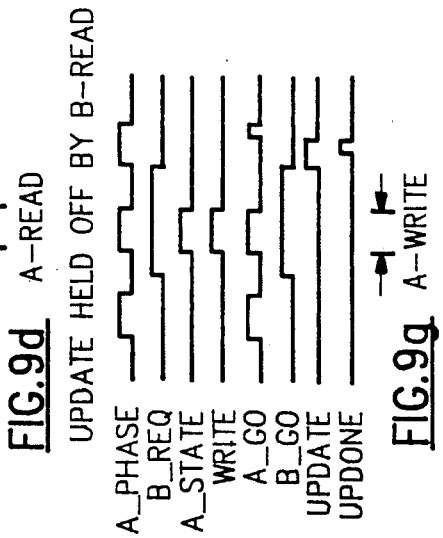
FIG.9c B-READ HELD OFF BY UPDATE
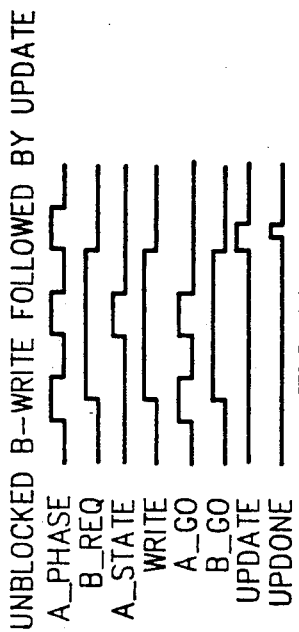
FIG.9d UNBLOCKED A-READ
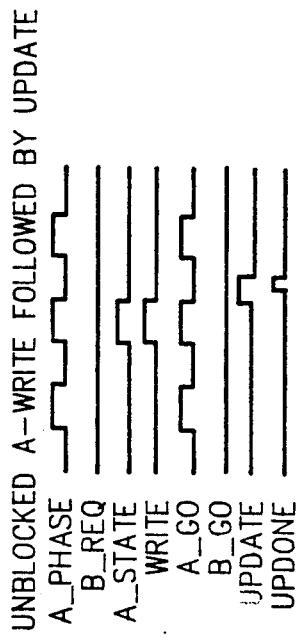
FIG.9e UNBLOCKED A-WRITE FOLLOWED BY UPDATE
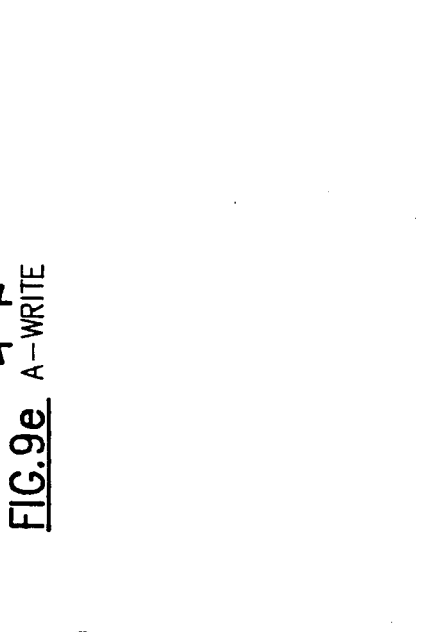
FIG.9f A-READ HELD OFF BY UPDATE
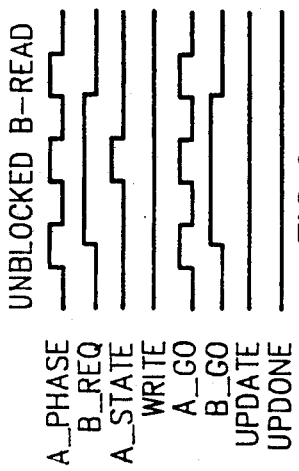
FIG.9g UPDATE HELD OFF BY B-READ
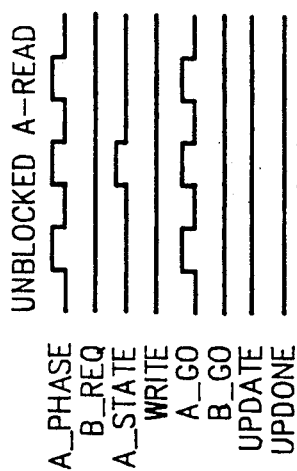

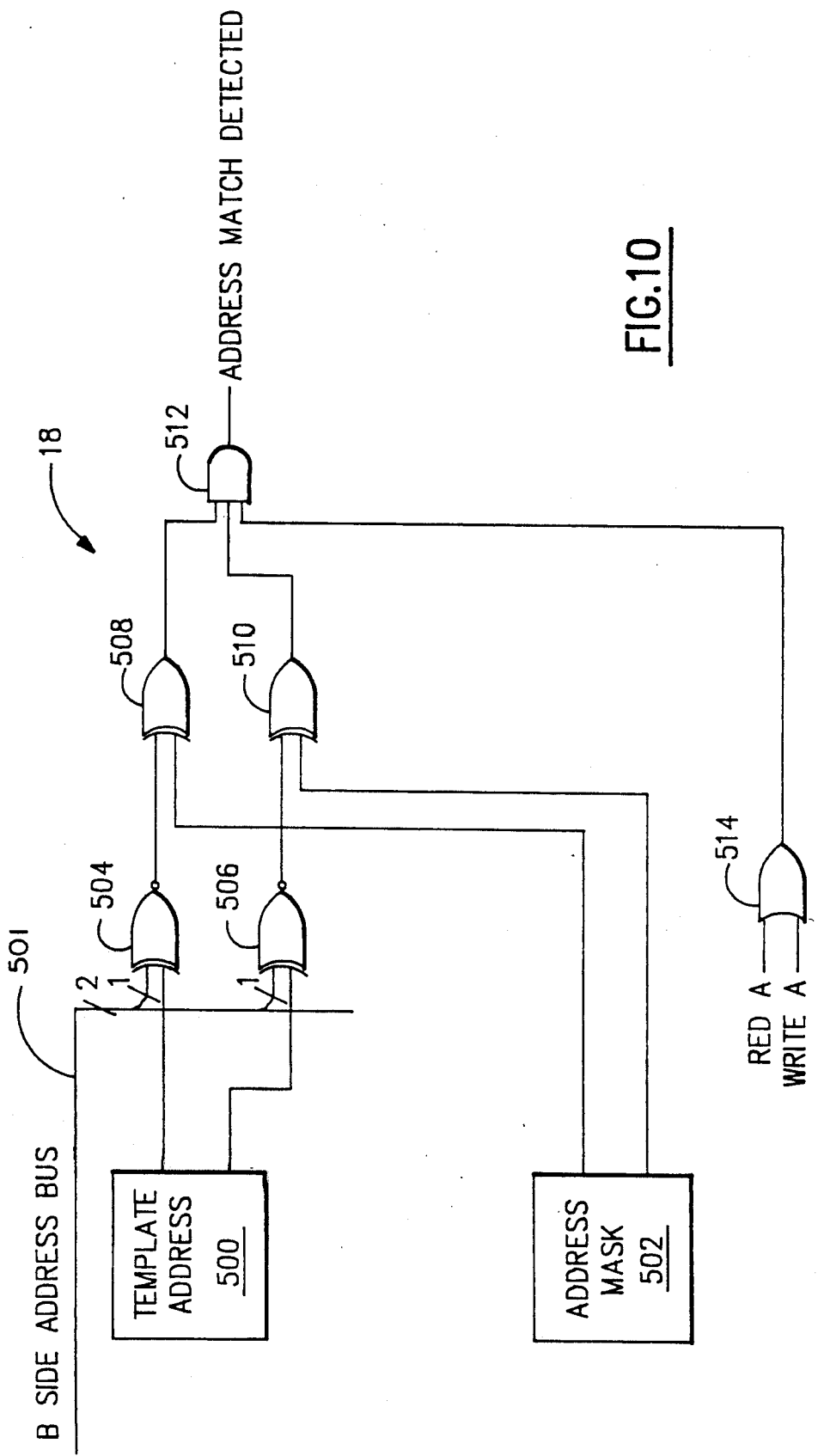

5,014,247

SYSTEM FOR ACCESSING THE SAME MEMORY LOCATION BY TWO DIFFERENT DEVICES

BACKGROUND OF THE INVENTION

The present invention relates to a dual port random access memory (RAM) and, more particularly, to a dual port RAM having shadowing capabilities to facilitate communication between two devices.

Heretofore, system designers have allowed two intelligent devices, such as controllers or processors, to communicate with one another. The use of random access memory has facilitated such communication or data transfer between devices. In other words, one device can generate data that the second device uses. Bidirectional communication is, of course, also necessary with a RAM, so that the second device can generate data when the first device is the recipient thereof.

The use of random access memory also allows data to be updated, either by the originating device or by the receiving device at a later time.

To solve the problem of data access by two devices concurrently or approximately concurrently, dual port RAM have been developed. The dual port RAM of the prior art, however, has certain drawbacks, including potential for significant access time penalties due to the fact that one device must finish writing data into a location before the second device attempts to do so or before the second device attempts to read the data.

Contention problems occur when both devices write, or when one device reads while the other device attempts to write, to the same location in memory. Generally, and fortunately, contention does not exist when two devices attempt to read the same data. Moreover, determining which device should get access to the memory (i.e., arbitration) and determining the length of delay required before a given device is allowed access to memory may also be significant, time consuming factors.

The amount of data access required of a RAM device during any period of time is uncertain. Record keeping, testing and the like can occur before a device is allowed to access memory previously updated by the other device. The prior art teaches the use of certain control signals, such as READY and ACKNOWLEDGE, to keep track of access interleaving from the devices.

Another problem occurs when two disparate devices are used with one dual port RAM. The dual port RAM generates certain control signals that may not be suitable for all devices that access data stored in RAM. Accordingly, so called "glue logic" is required to smooth the transition between data generated by one controller and accessed by another or for data that is to be accessed by two or more controllers.

It would be advantageous to interface two or more devices such as processors to one another in a simple system design.

It would also be advantageous to facilitate communications between two devices by use of a dual port RAM.

It would also be advantageous to provide a dual port RAM that would allow two devices to access data therein approximately simultaneously.

It would also be advantageous to eliminate control signals when accessing data in predetermined memory locations of RAM.

It would also be advantageous to eliminate glue logic and other measures conventionally required to allow two disparate devices to communicate with one another.

It would also be advantageous to provide a mechanism for updating data stored in a dual port RAM so as to facilitate access to the updated data by disparate devices connected thereto.

It would also be advantageous to provide a dual port RAM with relatively high operating speeds and low costs.

It would also be advantageous to provide a system that includes a fixed access time for devices with synchronized bus cycles to interface to RAM.

It would also be advantageous to provide a dual port RAM, one device and the interface means therefor on a single IC chip.

SUMMARY OF THE INVENTION

In accordance with the present invention, there is provided a dual port random access memory device having a memory location which has interfaces for allowing at least two devices to access a given memory location. The memory location is subdivided into at least two portions. One of the portions is a source and one of the portions is a destination. A shadow updating mechanism is provided and connected to each of the memory location portions for allowing data stored in one of the portions to be copied into the other portion.

BRIEF DESCRIPTION OF THE DRAWINGS

A complete understanding of the present invention may be obtained by reference to the accompanying drawings, when taken in conjunction with the detailed description thereof and in which:

FIGS. 9a–9g are timing diagrams of arbitration logic of the presen invention; and FIG. 10 is a schematic diagram of PMAR logic used in conjunction with the dual port RAM of the present invention.

DESCRIPTION OF THE PREFERRED EMBODIMENT

Figure 1:
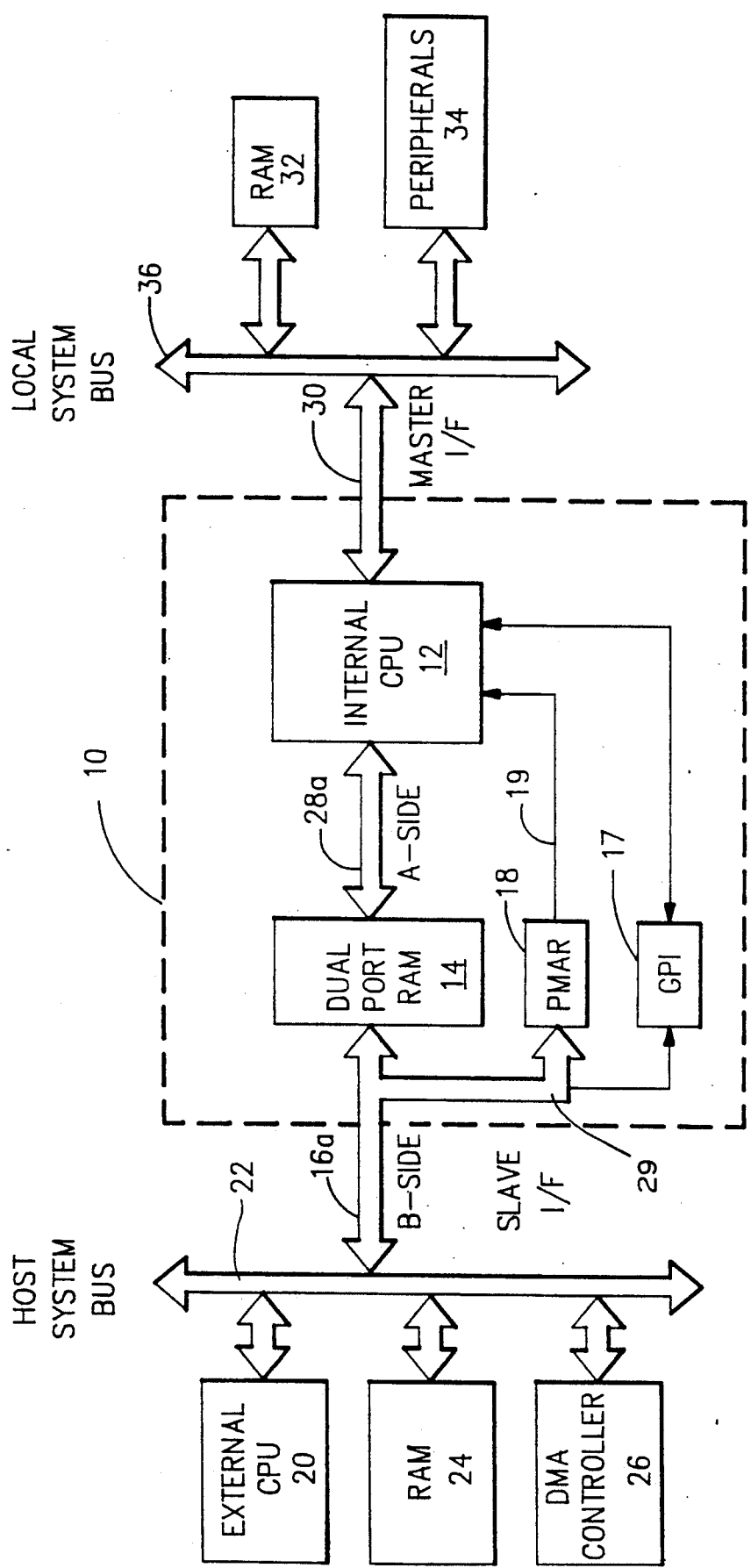
FIG. 1 is a block diagram depicting the dual port RAM of the present invention.

Referring now to FIG. 1, there is shown a block diagram of the system in accordance with the present invention. A microcontroller is shown generally at reference numeral 10. A suitable microcontroller is Model No. 80C525, available from Advanced Micro Devices, Inc. Microcontroller 10 includes an internal CPU 12, such as Model No. 80C521, also available from Advanced Micro Devices, Inc. and described more fully in copending patent application Ser. No. 176,076 filed April 18, 1988, now abandoned which is hereby incorporated by reference. It should be understood, however, that any device, regardless of intelligence, such as controllers, processors and the like, can be used as an internal CPU 12. Similarly, the present invention is not limited to use with an internal device, but can facilitate data communications between two external devices. It is most efficient, however, to provide CPU 12 and other components on a single integrated circuit chip, resulting in microcontroller 10.

A dual port RAM 14 is included in micro controller 10. Access time for the dual port RAM 14 is about 90 ns, providing a guaranteed maximum access time under all conditions. Dual port RAM 14 is connected to internal CPU 12 over an interface bus, shown generally as reference numeral 28a and identified by the term "A-side" or "A-interface". A-side interface bus 2a is described in greater detail hereinbelow. Also connected to CPU 12 is a programmable maskable address recognizer (PMAR) 18. An interrupt flag line 19 is applied from PMAR 18 to internal CPU 12.

Microcontroller 10 is connected to an external CPU 20, such as Model No. 80C521 available from Advanced Micro Devices, Inc., by means of a host system data communications bus 22. Also connected to host system bus 22 is an external RAM 24 and a DMA controller 26, the details of which are well known in the art and need not be described here.

Microcontroller 10 is connected to host system bus 22 over a slave interface bus 16a, identified by the term "B-side" or "B-interface". B-side slave interface bus 16a comprises a data communications bus, an address bus, a READ signal and a WRITE signal. PMAR 18 is connected to B-side slave interface bus 16a by means of a bus 29.

A general purpose interrupt (GPI) device 17 is provided between B-side interface bus 16a and internal CPU 12.

In the preferred embodiment, external CPU 20 is the master of host system bus 22 and of B-side slave interface bus 16a. It should also be understood that DMA controller 26 can become master of host system bus 22 when it must access dual port RAM 14.

Connected to micro controller 10 by means of a master interface 30 are another external RAM device 32 and assorted peripherals, shown generally as reference numeral 34. RAM 32 and peripherals 34 are connected to one another and to master interface 30 by means of a local system communications bus 36. diagram of dual port RAM 14 (FIG. 1) in greater detail. Dual port RAM 14 consists not only of memory locations in an array 40, as described below, but also A-interface and B-interface, 28 and 16, shown and described in greater detail below. Array 40 contains register pairs, not shown in this FIGURE. Arbitration logic 218 and 220 is provided between interfaces 28 and 16 and in communicative relation to array 40.

A-interface 28 decodes address locations and delays read and write accesses to array 40 until permission is given by A_RDGO and A_WRGO signals from arbiters 220 and 218, respectively. A-reads cannot be performed until the A_RDGO signal is generated, since the A_DATA bus 28a is a precharged bus. Data read cannot be changed after a read operation begins.

B-interface 16 decodes address locations and delays write accesses to array 40 until permission is given by B_WRGO signal from arbiter 220. B-interface 16 also moves data from B_DATA external data bus 22 to/from the B DATA internal data bus 16a for B-writes and B-reads respectively. B-interface 16 differs from A-interface 28 in that B-interface 16 can initiate B-reads without requiring permission from arbiter 218 and 220, due to the fact that B_DATA bus 16a is a statically driven bus and can change value early in the read access.

Arbiter logic 218 controls A-writes, B-reads and A to B shadow updates, while arbiter logic 220 controls B-writes, A-reads, and B to A shadow updates.

Figure 3:
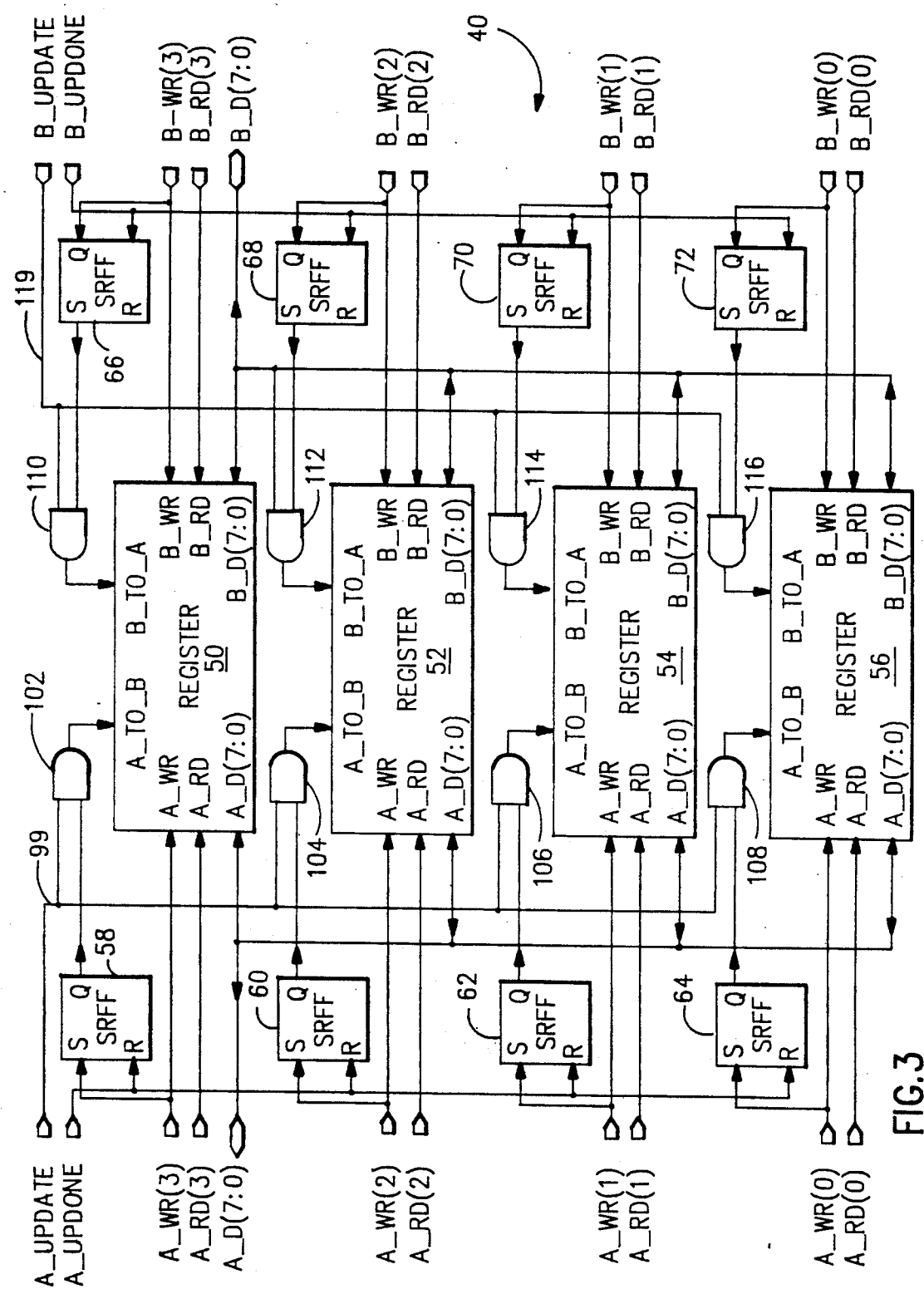
FIG. 3 is a block diagram depicting the internal structure of the array shown in FIG. 2.

Referring now also to FIG. 3, a plurality of 8-bit registers, representing memory locations is shown as reference numerals 50, 52, 54 and 56. For purposes of description and simplicity, only four memory locations are shown in this FIGURE, but in the preferred embodiment 16 memory locations are used. Moreover, any number of memory locations can be used in order to fulfill specific predetermined functions and capabilities of a designer-defined system environment.

Each memory location 50-56 has two parts or portions: an A-side and a B-side. The A-side of each register 50-56 is adapted to write data to, or read data from, A-interface 28, while the B-side of each register 50-56 is similarly adapted to write data to, or read data from, B-interface 16.

Figure 4:
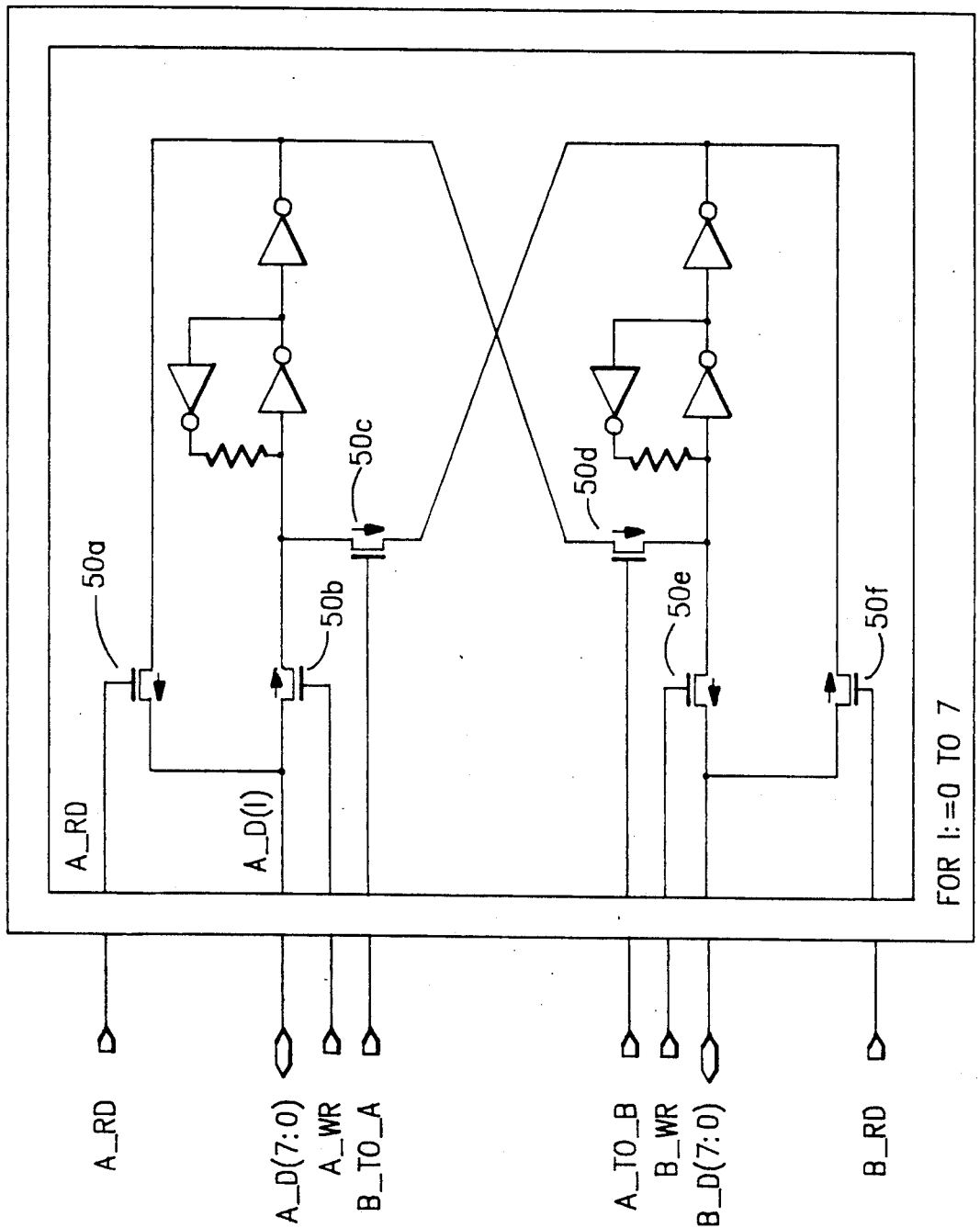
FIG. 4 is a schematic diagram of one of the registers shown in FIG. 3.

Referring now also to FIG. 4, a typical register 50 is shown in greater detail. Transistors 50c-50d are arranged so as to allow data from the A-side of register 50 to be transferred to the B-side thereof and likewise to allow data from the B-side of register 50 to be transferred to the A-side thereof. In other words, transistors 50a and 50b allow read/write of A-side of register to/from A-interface, while transistor 50e and 50f allow read/write of B-side of register to/from B-interface.

Referring again to FIG. 3, also connected to registers 50-56 are indicating or update needed set/reset flip flops 58-72, which indicate whether a write operation has occurred for the corresponding memory register A-side or B-side. When a write operation has occurred, the status of flip-flop 58-72 indicates to the system that a copy or shadow operation should also be performed for data on one side of a register 50-56 to the other side thereof. The set position dominates over clear in these conventional flip flops 58-72 when both set and reset are asserted.

In operation, when an A-UPDATE signal is asserted, any needed updates from the A-side to the B-side of a register 50-56 will begin. When these updates are performed, an A-UPDONE signal clears the corresponding A to B update needed flip flop 58-64. The B to A update needed flip-flops 66-72 indicate that data is to be copied from the B-side to the A-side of register 50-56. B-UPDATE and B-DONE signals are used in such situations to initiate/terminate these shadow updates.

The A-UPDATE signal is generated by arbitration logic, not shown in this FIGURE, and is applred over line 99, connected to AND gates 102-108. The outputs of AND gates 102-108 are, in turn, applied to the A-side of registers 50-56, respectively.

Likewise, the B-UPDATE signal is generated by arbitration logic, not shown, and is applied over line 119, connected to AND gates 110-116. The outputs of AND gates 110-116 are, in turn, applied to the B-side of registers 50-56, respectively.

Figure 5:
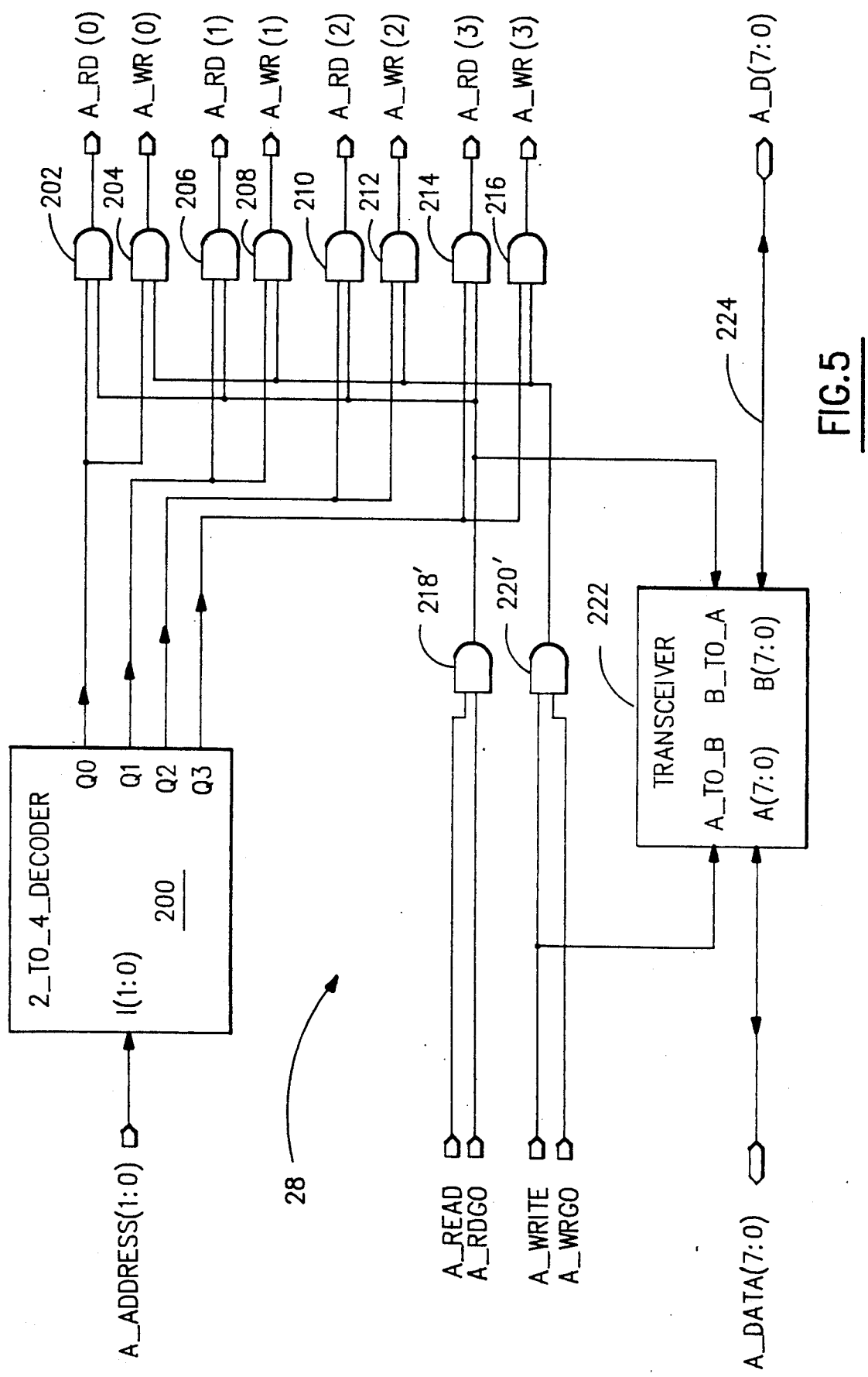
FIG. 5 is a block diagram showing the A-side interface of the present invention.

Referring now also to FIG. 5, there is shown a block diagram of A-side slave interface 28 (FIG. 1). An A-side address (A_ADDRESS signal) is applied to a 2-to-4 address decoder 200, which performs standard binary decode operations. Address decoder 200 has four output lines (Q0-Q3) applied to read and write AND gates 202-216, as depicted in the FIGURE. A read request (A_READ) signal and a read permission granted (A_RDGO) signal are applied to another AND gate 218', the output of which is combined with the outputs of decoder 200 by read AND gates 202, 206, 210, and 214 to generate explicit read signals A_RD(0) -A_RD(3) to array 14.

Similarly, a write request (A_WRITE) signal and a write permission granted (A_WRGO) signal are applied to another AND gate 220', the output of which is combined with the decoded outputs of decoder 200 by write AND gates 204, 208, 212 and 216 to generate explicit write signals A_WR(0) -A_WR(3) to array 14.

A-side slave interface 28 also includes a data transceiver 222 to which is applied the A_WRITE signal and the output of AND gate 218'. Transceiver 222 transfers data from a buffered data bus 224 to internal data bus 28a during a read operation, after permission is granted by the A_RDGO signal. This prevents writing bad data onto the precharged A_DATA bus.

Similarly, data transceiver 222 transfers data to buffered data bus 224 from internal data bus 28a during a write operation. Since buffered data bus 224 is a static bus, the A_WRGO signal is not required to enable this transfer.

Figure 6:
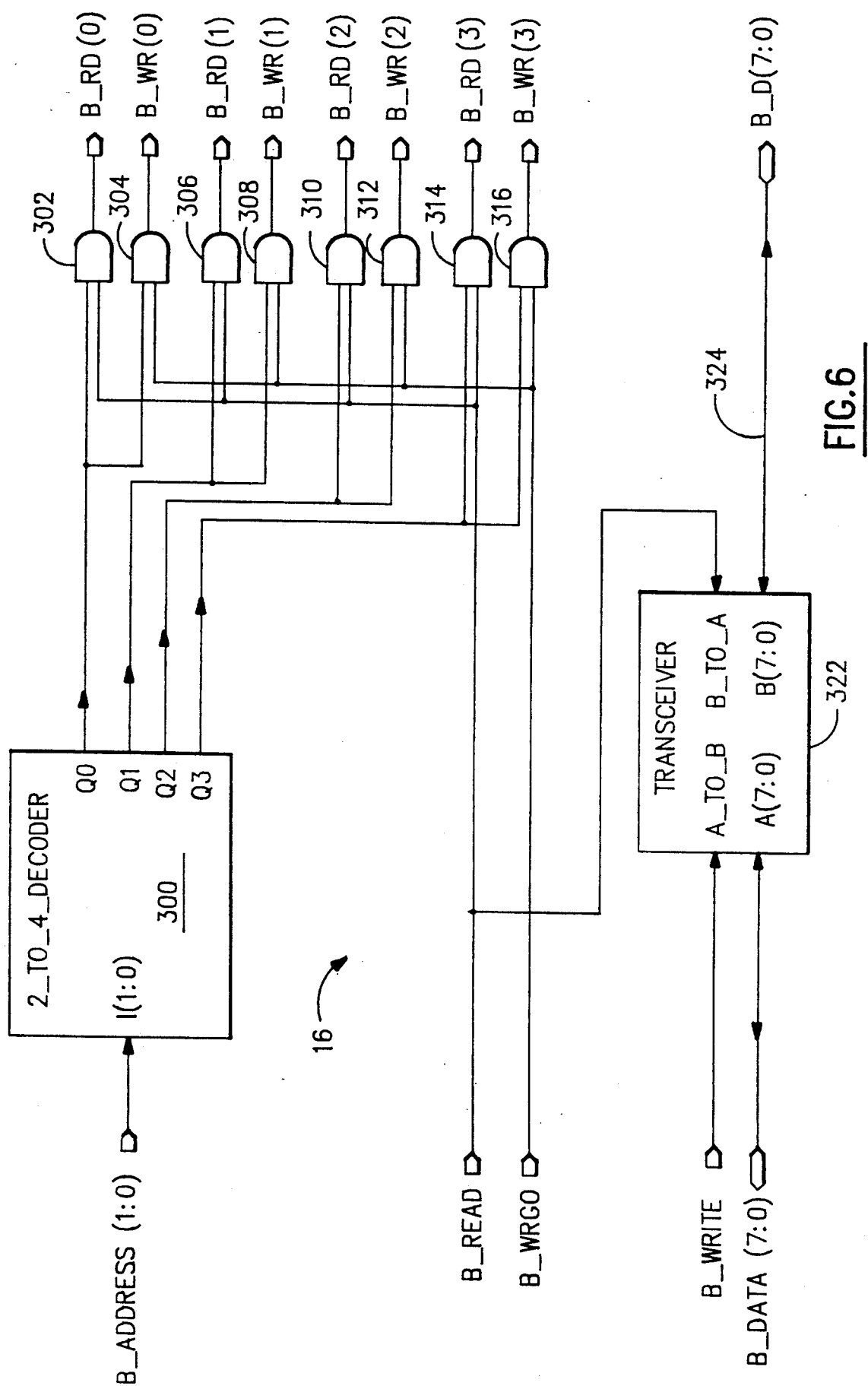
FIG. 6 is a block diagram showing the B-side interface of the present invention.

Referring now also to FIG. 6, there is shown a block diagram of B-side interface 16a (FIG. 1). A 2-to-4 address decoder 300 has a B-side address (B_ADDRESS) signal applied to it and generates four output signals (Q0-Q3) that are applied to read and write AND gates 302-316, as depicted in the FIGURE. A read request (B_READ) signal is combined with the decoded outputs of decoder 300 by read AND gates 302, 306, 310 and 314 to generate explicit read signals B_RD(0) -B_RD(3) to array 14.

Similarly, a write permission granted (B_WRGO) signal is combined with the decoded outputs of decoder 300 by write AND gates 304, 308, 312 and 316 to generate explicit write signals B_WR(0) -B_WR(3) to array 14.

B-side interface 16 also includes a data transceiver 322 to which is applied the B_WRITE and the B_READ signals. Transceiver 322 transfers data from buffered data bus 324 to external data bus 16a during a read operation.

Similarly, transceiver 322 transfers data from external data bus 16 to buffered data bus 324 during a write operation. Since both buffered data bus 324 and external bus 16a are static buses, neither the B_WRGO nor the B_RDGO signal is required to enable these transfers.

Figure 2:
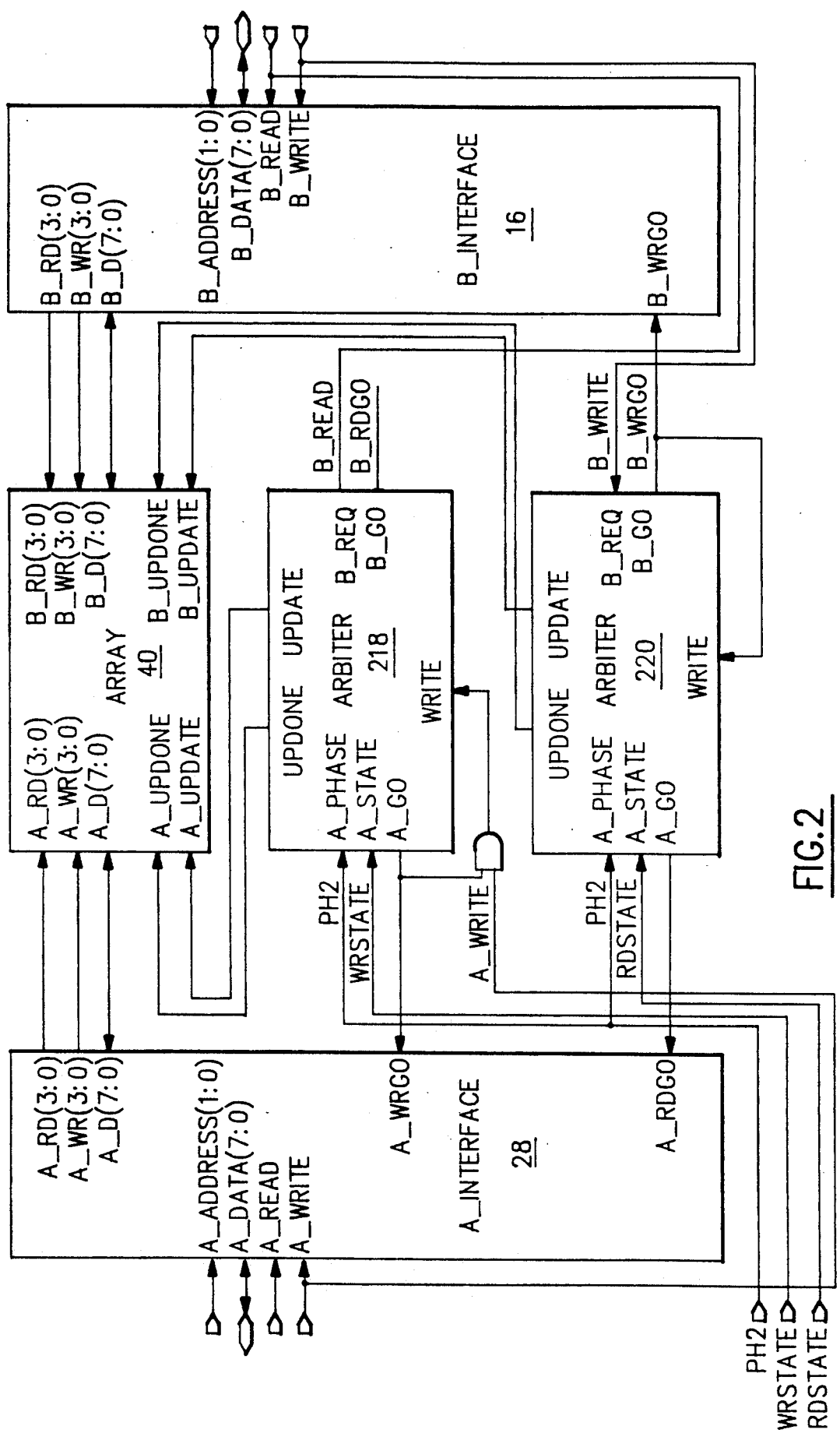
FIG. 2 is a block diagram depicting the internal structure of the dual port RAM shown in FIG. 1.
Figure 7:
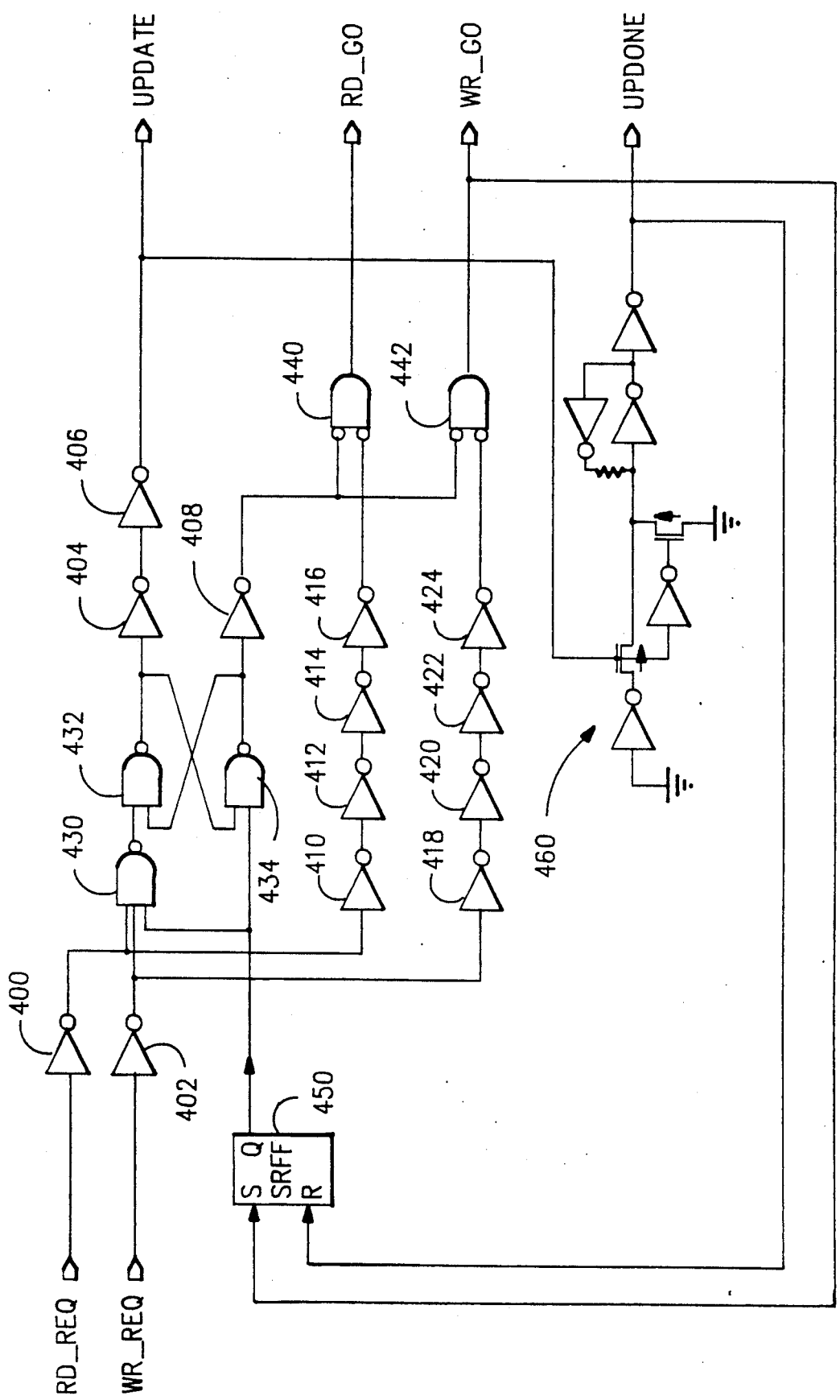
FIG. 7 is a schematic diagram of arbitration logic used in the dual port RAM in accordance with an alternate embodiment of the present invention.

Referring now also to FIG. 7 there is shown a schematic diagram of an alternate embodiment arbitration logic units 218 and 220 (FIG. 2) in greater detail. The arbiter logic shown in FIG. 7 can be used for arbiter 218 to perform A-write, B-read and A-to-B update operations and the same arbiter logic (FIG. 7) can be used for arbiter 220 to perform B-write, A-read and B-to-A update operations. Thus, write operations are initiated by the A- or B-side of dual port RAM 14 and are suitably handled by the appropriate arbiter 218 or 220.

Arbiter logic comprises 13 inverters 400-424, 3 NAND gates 430-434, 2-NOR gates 440, 442, a set/reset flip-flop 450 and a reference update bit, shown generally at reference numeral 460. The circuitry is adapted to receive a read request or a write request signal from either the A- or the B-side of dual port RAM 14. The output of this arbiter results in one or more of the following signals being set: UPDATE, RD_GO, WR_GO and UPDONE for the respective A- or B-side of RAM 14. The read request signal is inverted by inverter 400 and applied to NAND gate 430. Similarly, write request signal is inverted by inverter 402 and applied to NAND gate 430. The output of NAND gate 430 (active low) is asserted when there are no pending read or write requests and an update is required. An update cycle can be initiated only when these conditions are met.

NAND gates 432 and 434 form a flip-flop that is set when an update begins. Flip-flop 432, 434 is cleared when an update operation terminates. Inverters 404 and 408 have trip points well below the metastable voltage of flip-flop 432, 434. If flip-flop 432, 434 hangs in a metastable condition and then resolves, while it is metastable no accesses or updates will be allowed to start. Instead, both the update request and the external request (either read or write) must wait for flip-flop 432, 434 to resolve.

Inverters 410-416 form a delay line to insure that flip-flop 432, 434 has had time to resolve or at least to reach a metastable condition, before a read access can be initiated. Delay line 410-416 corresponds to the delay required to propagate the RD_REQ signal through flip-flop 432, 434 and inverter 408.

Similarly, inverters 418-424 form a delay line to insure that flip-flop 432, 434 has had time to resolve or to reach a metastable condition, before initiating a write access. Delay line 418-424 corresponds to the delay of the WR_REQ signal propagated through flip-flop 432, 434 and inverter 408.

NOR gate 440 permits a read operation to begin after a sufficient amount of time has elapsed to decide that external access is allowed. If an update operation begins before the RD_REQ signal arrives, as soon as the update completes, flip-flop 432, 434 will reset and the RD_GO signal will be asserted.

Similarly, NOR gate 442 permits a write operation to begin after a sufficient amount of time has elapsed to decide to allow external access. If an update operation begins before the WR_REQ signal arrives, as soon as the update operation is terminated, flip-flop 432, 434 will reset and the WR_GO signal will be asserted.

Set/reset flip-flop 450 is set by a write operation to any location and is cleared when a reference update bit 460 is set.

Reference update bit 460 comprises circuitry that is physically placed at a remote location relative to the source of the UPDATE signal. That is, reference update bit 460 is placed in worst case physical position. When the UPDATE signal is asserted, a transfer is initiated in reference update bit 460. Upon completion of this transfer, the UPDONE signal is asserted, clearing the set/reset flip-flop 450. Conversely, when set/reset flip-flop 450 is cleared, the update condition is deasserted and any pending accesses are no longer blocked. Reference update bit 460 is then re-armed for the next update operation.

No READY, BUSY or WAIT line output or logic is associated with dual port RAM 14, because the arbitration scheme of the present invention guarantees data availability within a fixed access time. Dual port RAM access time is a maximum, worst-case value, and includes the case of a simultaneous access by internal CPU 12 or external CPU 20 at the same time that an update starts. When data from a memory location 50-56 is read by one CPU, 12 or 20, and written simultaneously by the other CPU, 20 or 12, data corruption cannot occur. Either the original data or the new data is presented to the reading CPU, 12 or 20. An external CPU 20 that interfaces to micro controller 10 need not include a READY line input, and can operate with fixed bus cycle times. Thus, external CPU(s) 20 may access dual port RAM 14 asynchronously with respect to internal CPU 12.

Dual port RAM 14 appears to external CPU 20 merely as 16 bytes of static RAM with a 90 ns access time. Similarly, micro controller 10 communicates with dual port RAM 14 as 16 special function registers and may access dual port RAM 14 at any time as if it were a set of such registers.

Figure 8:
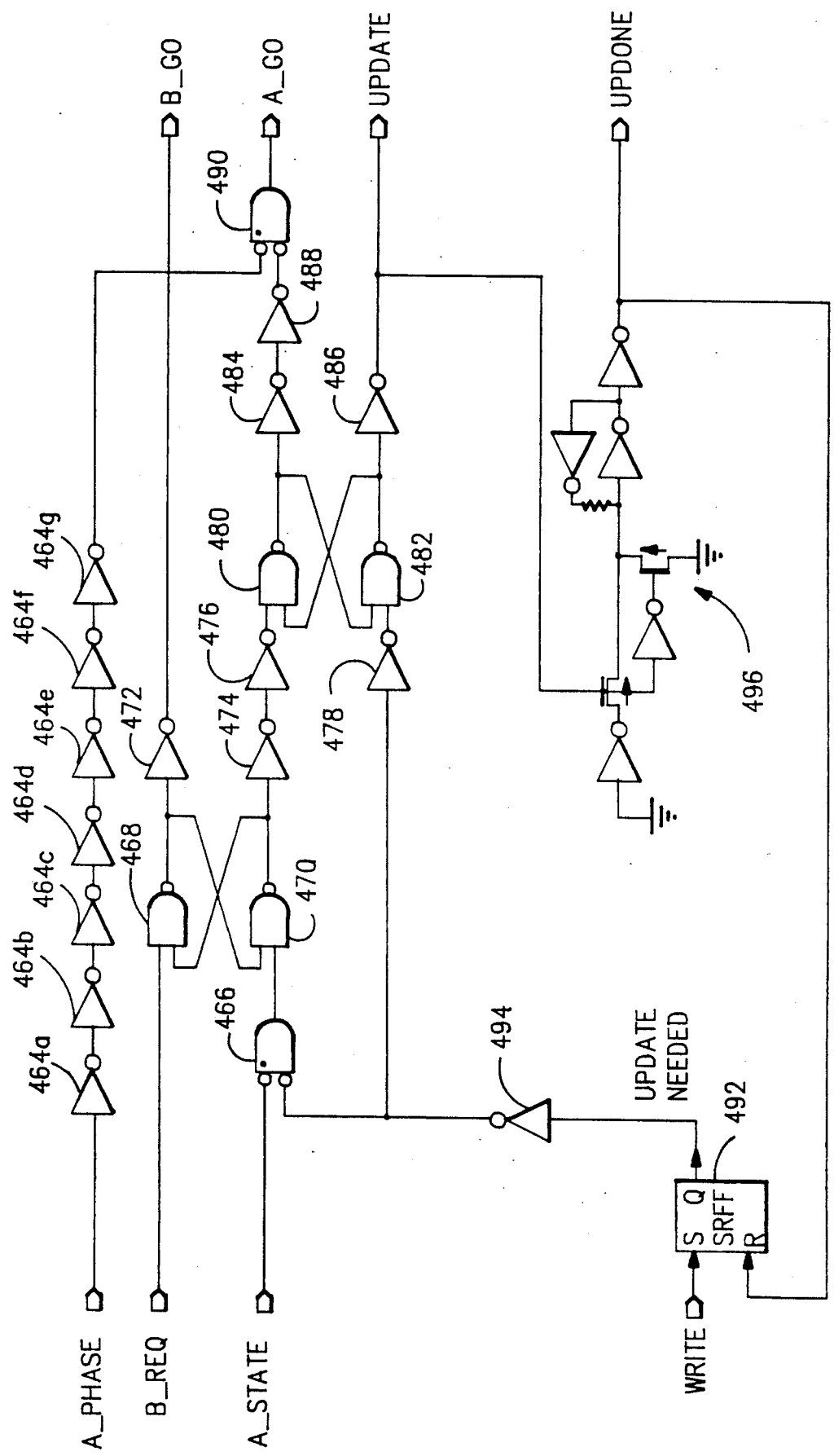
FIG. 8 is a schematic diagram of arbitration logic used in the preferred embodiment of the present invention.

Referring now to FIG. 8, there is shown a schematic diagram of the preferred embodiment arbitration logic unit for use as arbiter for 218 and arbiter 220. A delay line comprising 6 inverters 464a-464g is provided to delay the A_GO signal for a predetermined time.

NOR gate 466, NAND gates 468 and 470 and inverters 472, 474 and 476 form a first-come detector, adapted to arbitrate between the B_REQ signal and update requests. If the B_REQ signal arrives before an update is requested, the update request is blocked until the B-access operation is terminated and the B_REQ signal is deasserted. If an update signal arrives first, the B_REQ signal is delayed until the update operation is completed and an UPDATE_NEEDED signal is deasserted. Inverters 472 and 474 have trip points well below the metastable voltage of the first-come detector 468, 470. Thus, if first-come detector 468, 470 hangs in a metastable condition, access is denied to both B-accesses and updates until first-come detector 468, 470 resolves in either direction. Inverters 478, 484, 486 and 488, NAND gates 480 and 482 form a flip-flop. This flip-flop indicates that an update operation is in progress and is set when update operations are initiated. This flip-flop is cleared when update operations are terminated. Thus, short pulses and glitches caused by an update operation beginning just as an A-access is beginning, can be handled. The flip-flop either catches the pulse and sets itself or misses the pulse altogether. Inverters 484 and 486 have trip points well below the metastable voltage of NAND gates 480 and 482 so that both A-accesses and updates are forced to wait for flip-flop 480, 482 to resolve. Delay line 464a-464g together with NOR gate 490 delay A-accesses long enough to withdraw permission to begin an update operation. Flip-flop 480, 482 then also has time to flip or to enter a metastable condition.

Set/reset flip-flop 492 is set when a write operation to any register is performed. Flip-flop 492 indicates that one or more registers require an update window to perform a shadow update operation.

Reference update bit is shown generally at 496 and comprises circuitry that is physically placed at a remote location relative to the source of the UPDATE signal. That is, reference update bit 496 is placed in worst case physical position. When the UPDATE signal is asserted, a transfer is initiated in reference update bit 496. Upon completion of this transfer, the UPDONE signal is asserted, clearing the set/reset flip-flop 492. Conversely, when set/reset flip-flop 492 is cleared, the update condition is deasserted and any pending accesses are no longer blocked. Reference update bit 496 is then re-armed for the next update operation.

Referring now also to FIGS. 9a-9g, there are shown timing diagrams of arbitration logic units 218 and 220 in operation. These timing diagrams indicate the conditions by which data stored in dual port RAM 14 (FIG. 1) is accessed by two CPUs 12 and 20. It should be understood, however, that more than two devices can be used with suitable circuitry well known in the art to allow concurrent data accessing and communications.

When B-read operation is requested and no update is in progress (FIG. 9a), permission is granted immediately.

When a B-write operation is requested and no update is in progress (FIG. 9b), permission is granted immediately. As the write occurs, flip-flop 492 is set. As soon as the write operation terminates, an update operation is begun to update the side of the register 50-56 to which data was just written.

In the case of an A-write operation first occurring, an update operation is then needed (FIG. 9c). When the A-write operation terminates, the update operation is started. While the update is still in progress, a B-read operation is requested, but is delayed until the update is completed.

When an A-read operation is requested and no update is in progress (FIG. 9d), permission is granted immediately.

When an A-write operation is requested and no update is in progress (FIG. 9e), permission is granted immediately. As the write occurs, flip-flop 492 is set. As soon as the write operation terminates, an update operation is begun to update the side of the register 50-56 to which data was just written.

In the case of a B-write operation first occurring, an update operation is then needed (FIG. 9f). When the B-write operation terminates, the update operation is started. While the update is still in progress, an A-read operation is requested, but is delayed until the update is completed.

In the case of an A-write operation first occurring, an update operation is then needed. Before the A-write operation terminates, a B-read operation begins, so the update operation is delayed until the B-read operation terminates.

Recovery time is simply the delay required between read and write operations of the B-side slave interface 16a by external CPU 20. The time between successive reads or successive writes is about three clock cycles of micro controller 10 (i.e., about 200 ns with a 16 MHz clock). Thus, for certain faster external processors, back-to-back read/read or write/write instructions operating on the B-side slave interface 16a should be avoided. The recovery time between a read and a write operation, or a write and a read operation, however, is simply the set-up time for the address and chip-select on the next access. Thus, read/modify-write operations are easily implemented.

Referring now also to FIG. 10 there is shown a schematic diagram of programmable maskable address recognizer (PMAR) 18 (FIG. 1). PMAR 18 comprises two main components: a template address 500 and an address mask 502, the outputs of which are applied to inter-connecting gates 504-514, which are used to generate an ADDRESS MATCH DETECTED signal under suitable conditions. Template address 500 and address mask 502 are defined by internal CPU 12 (FIG. 1). Template address 500 is compared to A-side address bus 501 ignoring any bits corresponding to bits set in address mask 502. All unmasked bits, as detected by address mask 502, must compare favorably with B-side address bus 501 and template address 500 before the ADDRESS MATCH DETECTED signal is generated.

PMAR 18 allows interrupts to be generated when external CPU 20 (FIG. 1) accesses certain locations in RAM 24. These locations are programmable from one location up to the entire 16 byte array. Thus, an immediate indication of external CPU activities is available.

In slave mode, 16 bytes, not shown, of dual port RAM 14 are available to interface micro controller 10 to external CPU 20. This provides a mechanism to transfer commands, parameters, data and status information between micro controller 10 and a plurality of CPUs, not shown. In enhanced I/O mode, dual port RAM 14 becomes 16 bytes of additional, directly addressable RAM. Two of the 16 bytes are always bit addressable by internal CPU 12.

In slave mode, PMAR 18 generates an interrupt to internal CPU 12 whenever access to a given address or set of addresses in dual port RAM 14 is generated by external CPU 20. In enhanced I/O mode, an interrupt flag bit, not shown, of PMAR 18 can be generated over interrupt flag line 19 and used by internal CPU 12 to generate a software-induced interrupt.

As previously mentioned, dual port RAM 14 allows high speed, asynchronous communication of data from one CPU to another. PMAR 18 is enabled and produces an interrupt over interrupt flag line 19 when one (e.g., reference numeral 50a) of a selectable set (50) of dual port RAM addresses is accessed by external components 20, 24 or 26. A general purpose interrupt (GPI) 17 (FIG. 1) allows an external interrupt to be generated by internal CPU 12. GPI can be enabled, disabled and acknowledged by external CPU 20.

Functions of dual port RAM 14, PMAR 18 and GPI provide an efficient data exchange mechanism. Once command, status or other data has been written to dual port RAM 14 by external CPU 20, micro controller 10 can be made aware of it immediately through the interrupt over interrupt flag line 19 generated by PMAR 18. Similarly, once micro controller 10 has finished an operation relating to dual port RAM 14, it can subsequently use GPI to interrupt external CPU 20.

From the foregoing description, it can be seen that the present invention operates as follows.

Data is transferred between CPU 20 and CPU 12, both of said CPUs being connected to dual port RAM 14. Data is written to a first portion of a memory location, for example, 50, in dual port RAM 14. Then data is transferred from the first memory location portion to a second portion of dual port RAM 14. The data is then read from second memory location. The data transfer is inhibited when data is being written into dual port RAM 14. During the data transferring process, arbitration logic 218 and 220 determines when an attempted write operation occurs.

In other words, the present invention is a method for allowing simultaneous reading of data from and writing of data to dual port RAM 14. The method includes the steps of providing dual port RAM 14 having a number of memory locations 50-56, each memory location having a first portion and a second portion for storing data. Data is written into the first memory location portion of one of the memory locations 50 and is then read from the second memory location portion 50 corresponding to the first memory location portion 50 concurrently with the step of writing data. Data is then transferred from the first memory location portion 50 to the second memory location portion during a predetermined period of time.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A dual port random access memory (RAM) device comprising:
    (a) a memory location defined by a multiple interface means comprising at least two address interfaces each of which communicate with respective ones of dual ports of a RAM for allowing at least two devices to access said memory location approximately at the same time, said memory location being subdivided into at least two portions, one of said portions being a source and one of said portions being a destination; and
    (b) shadow updating means operatively connected to each of said memory location portions for allowing data stored in one of said memory location portions to be copied into the others of said memory location portions.

2. The RAM device in accordance with claim 1 wherein data copied into said memroy location portions is the most recently modified data.

3. The RAM device in accordance with claim 1 further comprising a plurality of memory locations, each being subdivided into memory location portions and each bein individually accessible by means of said interface means.

4. The RAM device in accordance with claim 3 wherein each of said memory location portions comprises a plurality of bits.

5. The RAM device in accordance with claim 4 further comprising indicating means operatively connected to at least one of said memory location portions for indicating access of data therein.

6. The RAM device in accordance with claim 5 wherein said indicating means is programmable.

7. The RAM device in accordance with claim 6 wherein said programmable indicating means is adapted to determine data access of individual memory location portions.

8. The RAM device in accordance with claim 1 further comprising two devices operatively connected to said interface means.

9. The RAM device in accordance with claim 8 wherein said RAM, one of said devices, and said interface means therefor are disposed on a single integrated circuit chip.

10. The RAM device in accordance with claim 8 wherein one of said devices is adapted to operate synchronously with said RAM.

11. The RAM device in accordance with claim 8 wherein one of said devices comprises a controller.

12. The RAM device in accordance with claim 9 wherein one of said devices comprises a controller.

13. The RAM device in accordance with claim 10 wherein one of said devices comprises a controller.

14. The RAM device in accordance with claim 8 wherein one of said devices comprises a DMA controller.

15. The RAM device in accordance with claim 8 wherein said shadow updating means comprises arbitration means operatively connected to each of said memory location portions and responsive to the status of data stored therein.

16. The RAM device in accordance with claim 15 wherein said arbitration means is adapted to inhibit transfer of data between two of said memory location portions when any of said source memory location portions is being written to by one of said devices.

17. The RAM device in accordance with claim 15 wherein said arbitration means is adapted to inhibit the transfer of data between two of said memory location portions during a predetermined period of time.

18. The RAM device in accordance with claim 15 wherein said arbitration means is adapted to inhibit access of one of said memory location portions by one of said devices.

19. The RAM device in accordance with claim 18 wherein said arbitration means comprises worst case transfer means for determining the point at which every update operation would be complete.

20. The RAM device in accordance with claim 19 wherein said worst case transfer means comprises a reference bit.

* * * * *